(12) United States Patent
Sugiyama (10) Patent No.: US 10,355,448 B2
(45) Date of Patent: Jul. 16, 2019

(54) TUNABLE LASER SOURCE

(71) Applicant: Fujitsu Optical Components Limited, Kawasaki-shi, Kanagawa (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 15/606,876

(22) Filed: May 26, 2017

(65) Prior Publication Data

US 2017/0353008 A1  Dec. 7, 2017

(30) Foreign Application Priority Data

Jun. 7, 2016  (JP) .................................. 2016-113259

(51) Int. Cl.

| | | |
|---|---|---|
| *H01S 3/101* | (2006.01) | |
| *H01S 5/14* | (2006.01) | |
| *H01S 5/10* | (2006.01) | |
| H01S 3/083 | (2006.01) | |
| H01S 5/024 | (2006.01) | |
| H01S 5/0683 | (2006.01) | |
| H01S 5/227 | (2006.01) | |
| H01S 5/343 | (2006.01) | |

(52) U.S. Cl.
CPC .............. *H01S 5/101* (2013.01); *H01S 5/142* (2013.01); *H01S 3/083* (2013.01); *H01S 5/02415* (2013.01); *H01S 5/0683* (2013.01); *H01S 5/227* (2013.01); *H01S 5/34306* (2013.01)

(58) Field of Classification Search
CPC ...... H01S 5/06206; H01S 5/101; H01S 5/509; H01S 5/0265; H01S 5/10; H01S 5/0264; H01S 5/065; H01S 5/068
See application file for complete search history.

(56) References Cited

U.S. PATENT DOCUMENTS

| | | | | |
|---|---|---|---|---|
| 5,703,710 A | * | 12/1997 | Brinkman | ................ G02F 1/03 359/251 |
| 6,299,346 B1 | * | 10/2001 | Ish-Shalom | ........... G01J 5/0003 374/126 |
| 9,653,882 B1 | * | 5/2017 | Zheng | ................... H01S 5/0687 |
| 2003/0035449 A1 | | 2/2003 | Tomlinson et al. | |
| 2009/0122817 A1 | * | 5/2009 | Sato | ................... G02B 6/12007 372/20 |
| 2010/0316074 A1 | | 12/2010 | Fukuda | |

(Continued)

OTHER PUBLICATIONS

Chu et al. "Compact, lower-power-consumption wavelength tunable laser fabricated with silicon photonic-wire waveguide micro-ring resonators," Optics Express, vol. 17, No. 16, Aug. 2009, pp. 14063-14068.*

(Continued)

*Primary Examiner* — Yuanda Zhang (74) *Attorney, Agent, or Firm* — Staas & Halsey LLP (57) ABSTRACT

The invention relates to a tunable laser source, and the reduction in the loss and the size can both be achieved in a tunable laser source having a power monitor and a wavelength locker function. A tunable laser is formed of a semiconductor optical amplifier and a resonator, and one of the two output light beams split from part of the light within the tunable laser by a 2×2 type optical splitter is incident into a light intensity monitor, and the other is incident into a wavelength locker.

13 Claims, 12 Drawing Sheets

(56) References Cited

U.S. PATENT DOCUMENTS

| | | | |
|---|---|---|---|
| 2013/0243362 A1* | 9/2013 | Van Orden | G02B 6/26 |
| | | | 385/1 |
| 2014/0031678 A1* | 1/2014 | Yamada | A61B 5/0066 |
| | | | 600/425 |
| 2014/0328590 A1* | 11/2014 | Brenot | H04B 10/40 |
| | | | 398/42 |
| 2016/0013609 A1* | 1/2016 | Doerr | H01S 3/10015 |
| | | | 372/20 |
| 2017/0324218 A1* | 11/2017 | Krishnamoorthy | H01S 3/0637 |

OTHER PUBLICATIONS

Chinese Office Action for Chinese Patent Application No. 201710413621.6 dated Dec. 28, 2018.

* cited by examiner

TUNABLE LASER SOURCE

CROSS-REFERENCE TO RELATED APPLICATION

This application is based upon and claims the benefit of priority of the prior Japanese Patent Application No. 2016-113259, filed on Jun. 7, 2016, the entire contents of which are incorporated herein by reference.

FIELD

The present invention relates to a tunable laser source, and to a tunable laser source that is used for optical communication, for example.

BACKGROUND

In recent years, variable wavelength light sources of which the wavelength is variable in a wide range and of which the line width of the wavelength is as narrow as 100 kHz or less (particularly, a tunable laser source: TLS) have been vigorously developed for digital coherent communication of which the market scale has expanded due to the expansion of the long distance, large capacitance optical transmission systems. As an example of such a variable wavelength light source, a tunable laser can be cited where a silicon platform that is formed of a silicon-based material so as to have a wavelength filtering function and a semiconductor optical amplifier (SOA) that is formed of a compound semiconductor are combined.

Figure 10:
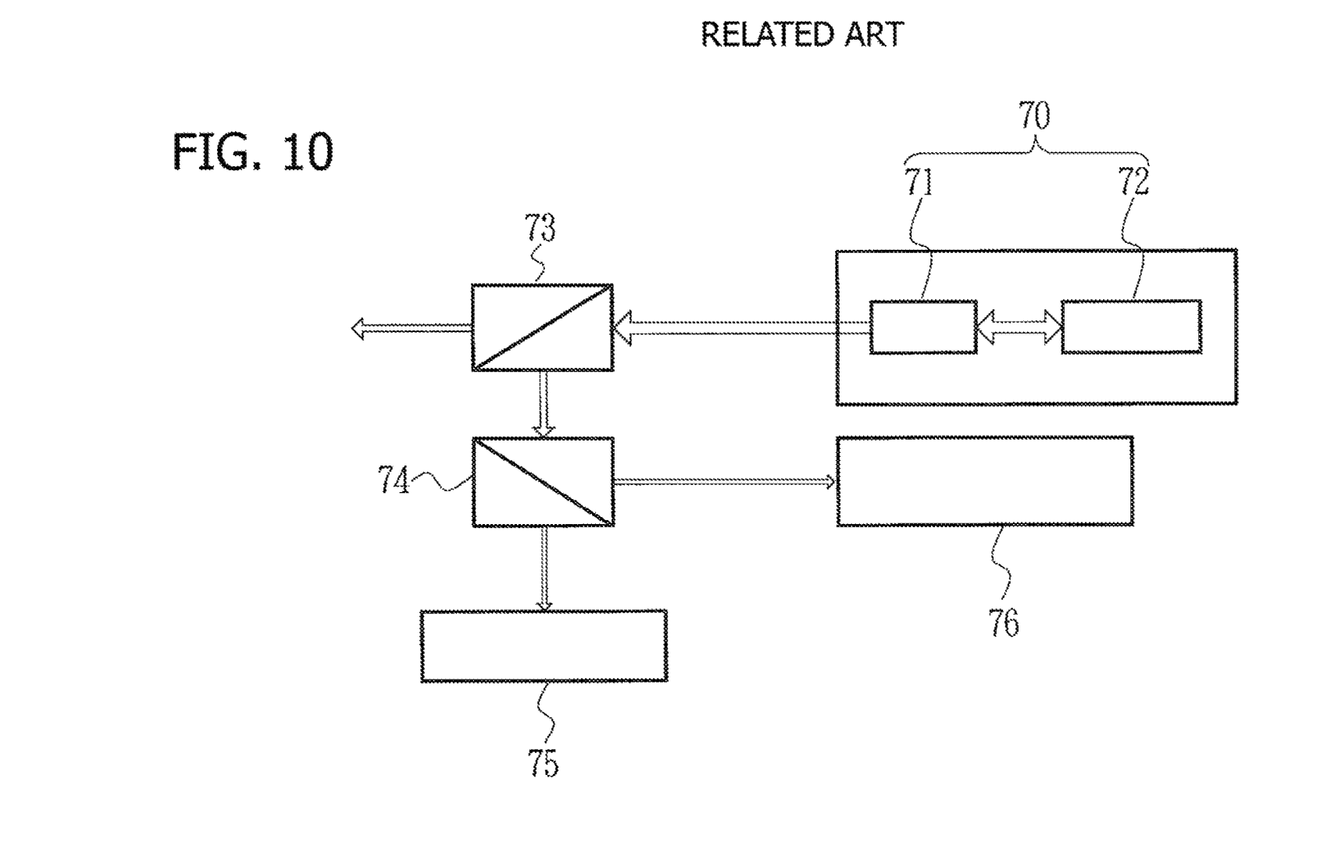
FIG. 10 is a schematic diagram illustrating the configuration of a conventional tunable laser source.

FIG. 10 is a schematic diagram illustrating the configuration of a conventional tunable laser source. A semiconductor optical amplifier 71 and a resonator 72 form a tunable laser 70. The resonator 72 is formed of a combination of an optical waveguide made of a silicon photonic wire formed on an SOI substrate, a ring resonator and a loop mirror. In this case, the cleavage surface of the semiconductor optical amplifier 71 on the output end side and the loop mirror form a laser resonator so that the light emitted from the semiconductor optical amplifier 71 enters into the resonator 72 so as to be amplified with a specific wavelength being resonated. Part of the amplified light is outputted from one end of the semiconductor optical amplifier 71 as output light. The ring resonator in the resonator 72 is controlled by a heater or the like that is provided on the ring resonator so that the wavelength of the output light can be tuned.

It is necessary in tunable laser sources to control the output power and the wavelength. For this purpose, a mechanism for monitoring the power and the wavelength of the output light is provided. Typically, part of the output light is split by a first optical splitter (Tap 1) 73 and further split by a second optical splitter (Tap 2) 74 so that two beams that have been split by the second optical splitter 74 are respectively incident into a power monitor 75 and a wavelength locker 76. In the case where the wavelength locker 76 detects a change in the wavelength, the output thereof drives the heater provided on the resonator 72 so as to offset the wavelength fluctuation.

PRIOR ART LITERATURE

Patent Literature

Patent Literature 1: U.S. Laid-open Patent Publication No. 2010/0316074

Patent Literature 2: U.S. Laid-open Patent Publication No. 2003/0035449

SUMMARY

The conventional configuration illustrated in FIG. 10 is provided with the tunable laser 70, the first optical splitter 73, the second optical splitter 74, the power monitor 75 and the wavelength locker 76 in different chips, and therefore, such a problem arises that the module is large in size.

Figure 11:
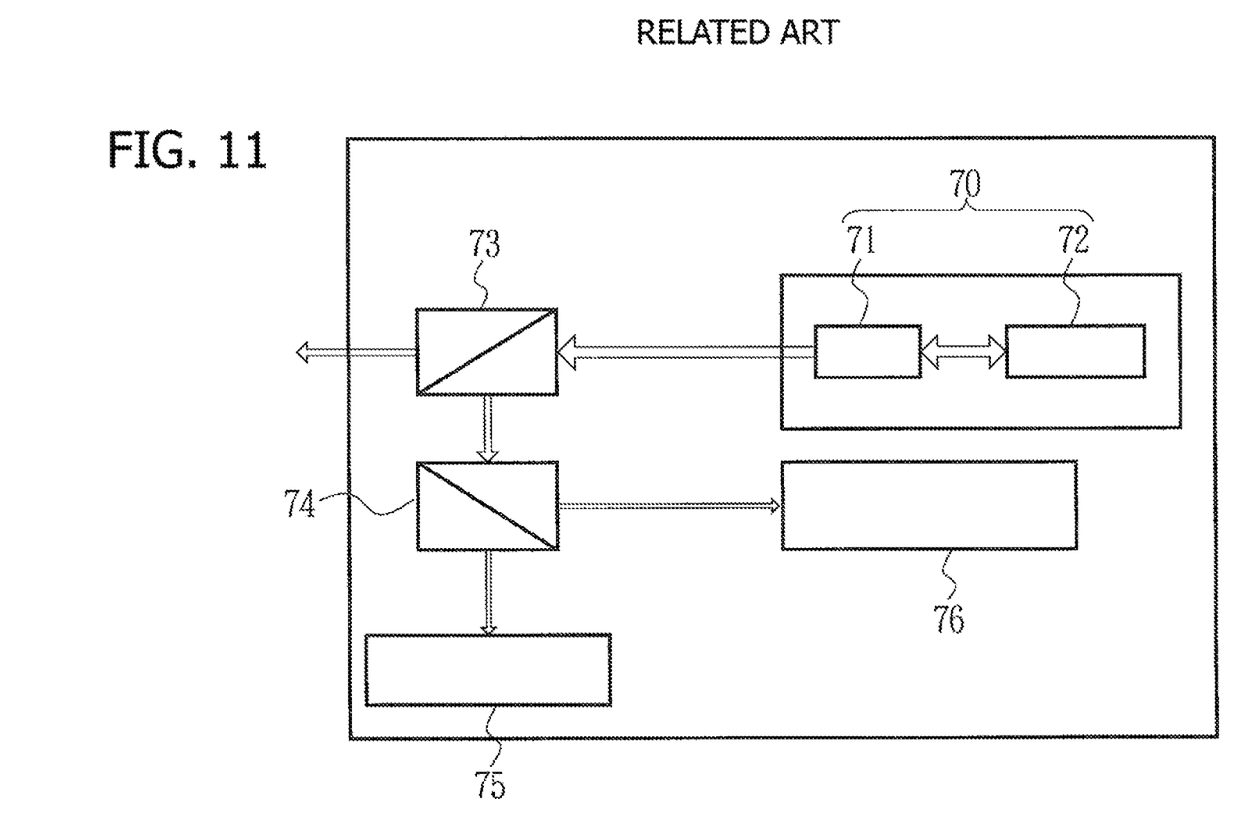
FIG. 11 is a schematic diagram illustrating the configuration of a tunable laser source in the case where the components are integrated.

Thus, as illustrated in FIG. 11, these components are all integrated on one chip so that the module can be miniaturized. In this case, though an example of the material for the chip is that for a planar lightwave circuit (PLC), it is desirable to use silicon from the point of view of miniaturization.

Meanwhile, a compound semiconductor such as InP is used for the photodiodes (PDs) within the semiconductor optical amplifier 71, the power monitor 75 and the wavelength locker 76, and therefore, the semiconductor optical amplifier 71 and the PD chips can be mounted on an SOI substrate, or the entirety including the optical splitters and the resonator can be formed of a compound semiconductor so that the mounting costs can be reduced.

Figure 12:
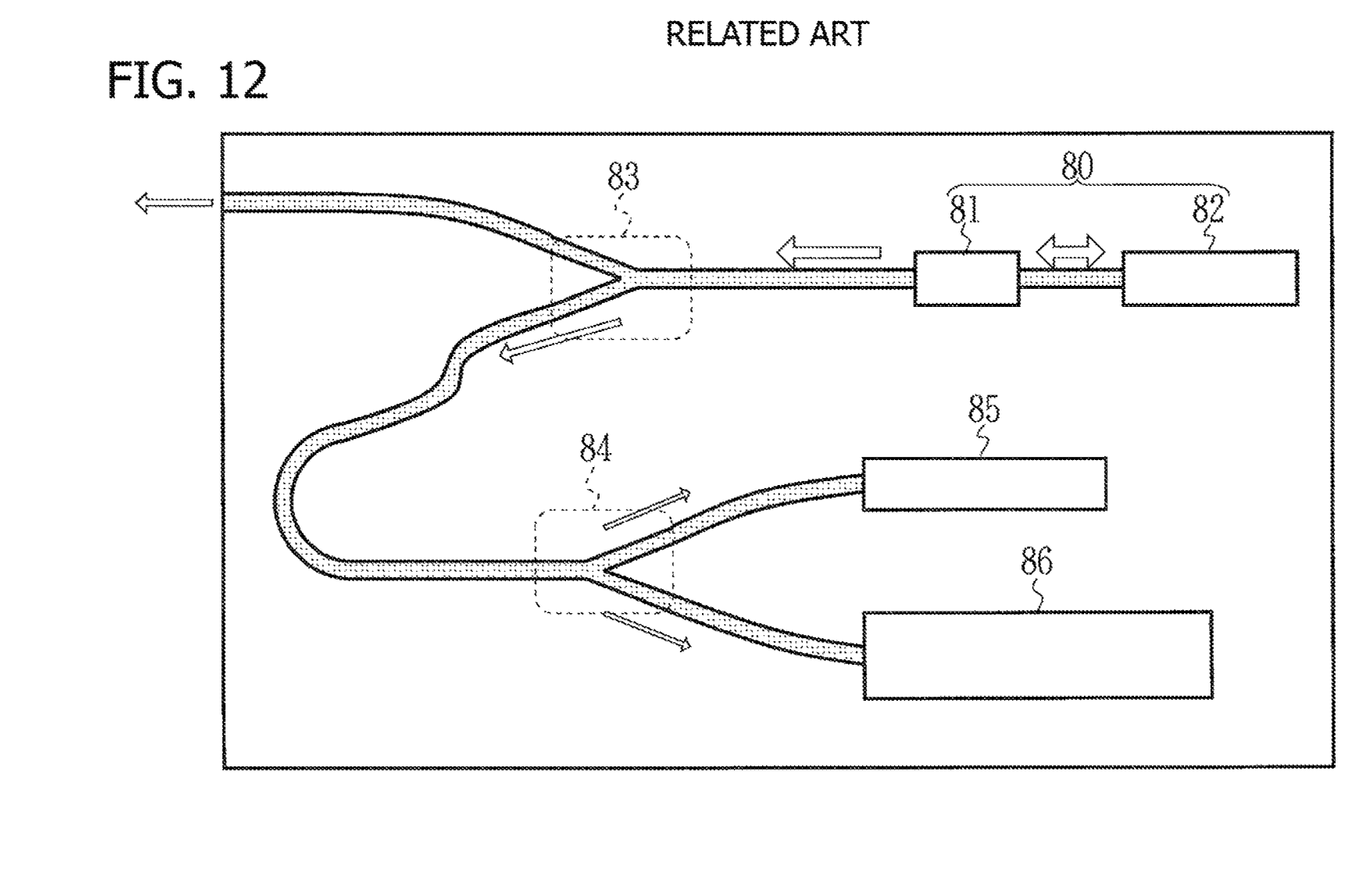
FIG. 12 is a schematic diagram illustrating the configuration of a tunable laser source in the case where Y-shaped branches are used as optical splitters.

In the case where light is split in a chip, as illustrated in FIG. 12, it is possible to provide a Y-shaped branch to the optical waveguide as an optical splitter. The light outputted from a tunable laser 80 that is made of a semiconductor optical amplifier 81 and a resonator 82 is split in two stages at a first Y-shaped branch 83 and a second Y-shaped branch 84, and the two beams that have split from the second Y-shaped branch 84 are incident into a power monitor 85 and a wavelength locker 86, respectively.

In the case where the Y-shaped branches are symmetric, light is split equally, and therefore, the use of symmetric Y-shaped branches allows one-fourth of the power that is outputted from the semiconductor optical amplifier 81 to be incident into the power monitor 85 and the wavelength locker 86, respectively. Meanwhile, the power of the output light outputted to the outside from the first Y-shaped branch 83 is one-half of the power that is outputted from the semiconductor optical amplifier 81.

The optical powers that are required for the power monitor 85 and the wavelength locker 86 are not so large, and the powers that are required for the power monitor 85 and the wavelength 86 are different. Accordingly, it is desirable from the point of view of reduction in the power consumption to adjust the split ratio of the first Y-shaped branch 83 and the second Y-shaped branch 84, respectively, in accordance with the light receiving sensitivities that are required for the wavelength locker 86 and the power monitor 85, respectively, so that the rest is designated as the output optical power.

In order to adjust the split ratio, the Y-shaped branch waveguide may be asymmetric. However, asymmetric Y-shaped branches have a large loss and branches are provided in two stages, and such a problem arises that the loss is further greater. In the case where the branches are provided in two stages, the second Y-shaped branch 84 must be inserted in the second stage after the two waveguides of the branch in the first stage have been sufficiently separated to such a degree as to not interfere with each other. Accordingly, a problem arises in that the size of the system increases.

A tunable laser source, including: a semiconductor optical amplifier; a resonator that forms a tunable laser together with the semiconductor optical amplifier; a 2×2 type optical splitter that is optically coupled with the semiconductor optical amplifier and the resonator and that splits part of the light within the tunable laser into two output light beams; a light intensity monitor into which one output light beam from among the two output light beams split by the optical splitter enters; and a wavelength locker into which the other output light beam from among the two output light beams split by the optical splitter enters.

According to one aspect of the invention, it is possible to reduce the loss and the size in a tunable laser source having a power monitor and a wavelength locker function.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
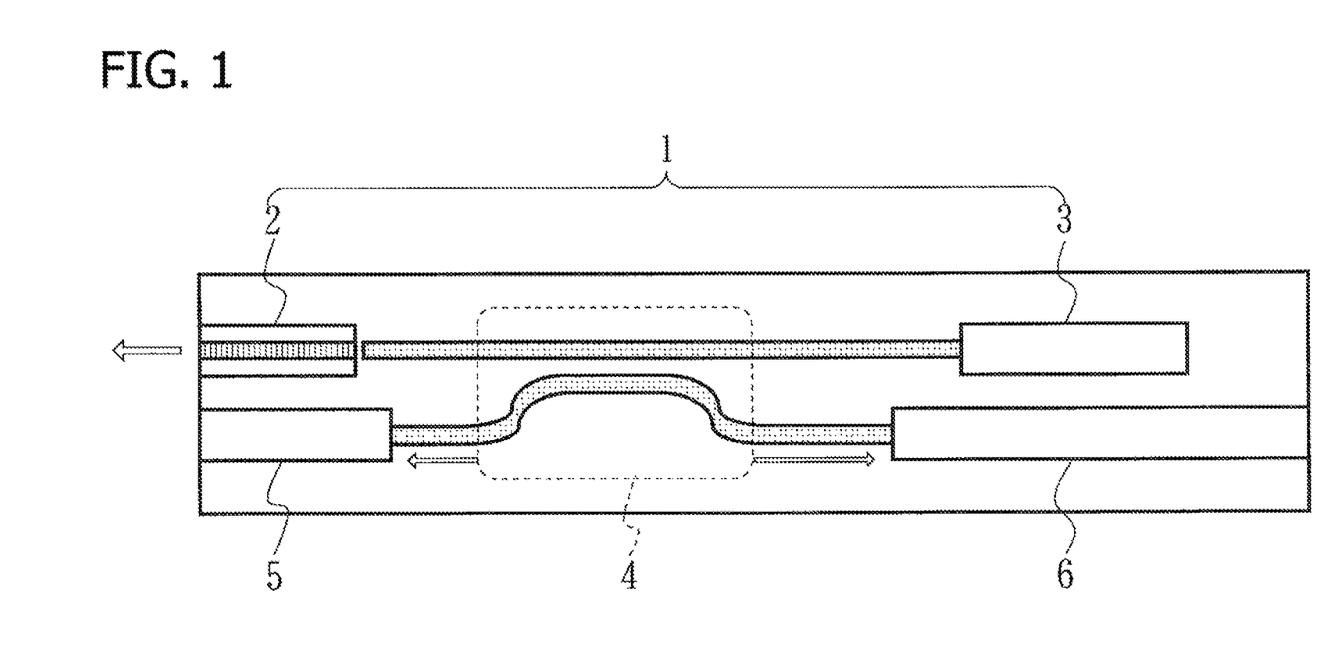
FIG. 1 is a schematic diagram illustrating the configuration of the tunable laser source according to the embodiment of the present invention.

In reference to FIG. 1, the tunable laser source according to an embodiment of the present invention is described. FIG. 1 is a schematic diagram illustrating the configuration of the tunable laser source according to the embodiment of the present invention. The tunable laser source according to the embodiment of the present invention has a semiconductor optical amplifier 2 and a resonator 3 that forms a tunable laser 1 with the semiconductor optical amplifier 2. In addition, the tunable laser source has a 2×2 type optical splitter 4 that splits part of the light outputted from the tunable laser 1, a light intensity monitor 5 into which one of the two beams that has been split from the outputted light by the optical splitter 4 is incident, and a wavelength locker 6 into which the other of the two beams that has been split from the outputted light by the optical splitter 4 is incident. The use of the 2×2 (two inputs, two outputs) type optical splitter 4 makes it possible for an optical splitter in only one stage to input light into the power monitor and the wavelength locker, and therefore, it is possible to reduce the loss in and the size of the system.

The wavelength locker 6 is formed of a waveguide that has an interferometer, and therefore has a loss to a certain degree, and thus, it is desirable for the input into the wavelength locker 6 to be greater than the input into the light intensity monitor 5. Meanwhile, the resonator 3 also has a loss of light, and therefore, the power incident into the optical splitter 4 from the semiconductor optical amplifier 2 side is greater than the power incident into the optical splitter 4 from the resonator 3 side. Accordingly, it is desirable for the outputted light that is incident into the light intensity monitor 5 to be the outputted light from the resonator 3 side split by the optical splitter 4, and for the outputted light that is incident into the wavelength locker 6 to be the outputted light from the semiconductor optical amplifier 2 side split by the optical splitter 4.

The optical splitter may be a directional coupler, a multimode interference (MMI) coupler or a crossing waveguide. In the case where a directional coupler is used, it is possible to reduce the loss, and in the case where a multimode interference (MMI) coupler is used, the split ratio of the wavelength characteristics can be reduced.

It is desirable for the resonator 3 to be a resonator that is formed of a silicon photonic wire using an SOI substrate for the purpose of miniaturization. In this case, a germanium photodiode that is formed in a germanium layer that is layered on top of a silicon layer may be used as the light intensity monitor. In the case where an SOI substrate is used, the semiconductor optical amplifier 2 made of a compound semiconductor is mounted in a region that is provided in a portion of the single crystal silicon substrate in the SOI substrate that has been dug down.

Alternatively, at least the semiconductor optical amplifier 2, the resonator 3, the optical splitter 4 and the light intensity monitor 5 may be formed of a III-V compound semiconductor such as an InGaAsP/InP-based semiconductor in a monolithic manner, which can reduce the costs for mounting.

Though the resonator 3 may have any structure, the resonator 3 may be formed of three optical waveguides, ring resonators that are provided between them as a wavelength adjusting means, and a loop mirror that is provided in the optical waveguide in the final stage as a light reflecting means. In this case, it is desirable to provide a heater for adjusting the resonating wavelength or the phase to a ring resonator or an optical waveguide.

In addition, the wavelength locker 6 may have any structure, and one example is one that splits the monitor output from the optical splitter 4 by a half mirror or a beam splitter so that the output in one direction is monitored by a photodiode and the output in the other direction is received by another photodiode through an etalon. The outputs detected by the two photodiodes are compared to detect a fluctuation in the wavelength.

According to the embodiment of the present invention, the use of the 2×2 type optical splitter 4 as an optical splitter can allow one optical splitter 4 to gain light to be incident into the light intensity monitor 5 and light to be incident into the wavelength locker 6. As a result, both a miniaturization of the tunable laser source and a reduction in the loss can be achieved.

EXAMPLE 1

Figure 2:
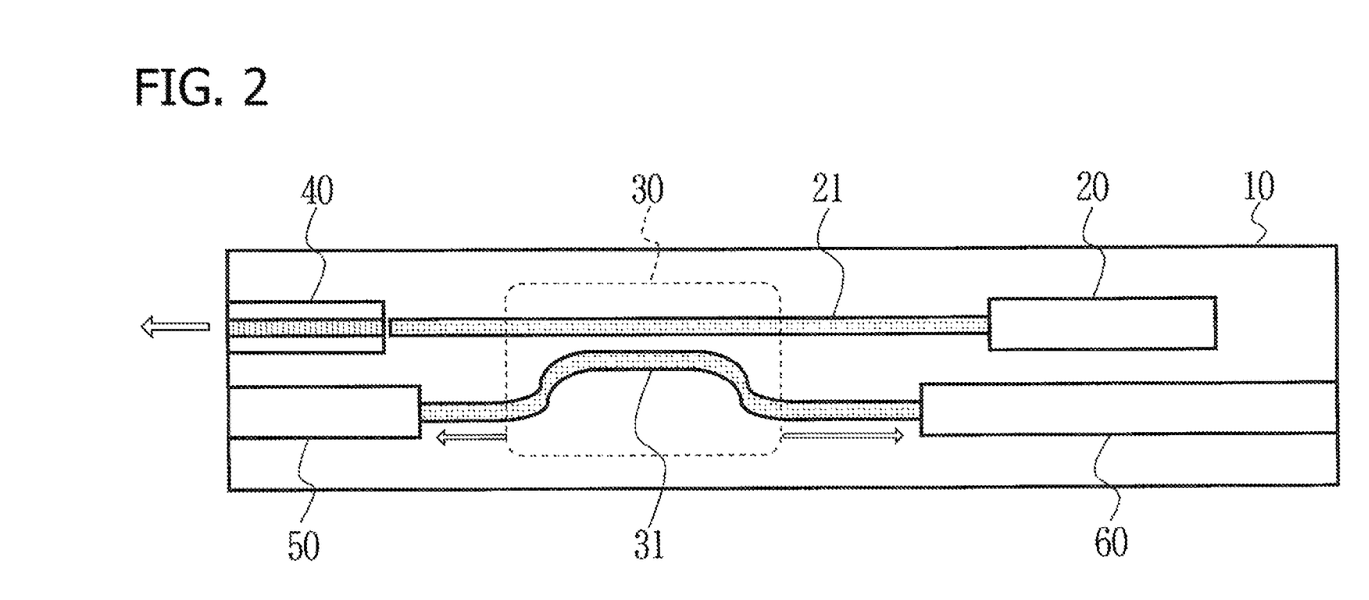
FIG. 2 is a schematic diagram illustrating the structure of the tunable laser source according to Example 1 of the present invention.

Next, the tunable laser source according to Example 1 of the present invention is described in reference to FIGS. 2 through 5. FIG. 2 is a schematic diagram illustrating the structure of the tunable laser source according to Example 1 of the present invention, where a tunable laser is formed of a resonator 20 that is formed on an Si photonic platform 10 using an SOI substrate and an SOA 40 that is provided with an MQW active layer that works as a gain waveguide. A power monitor 50 and a wavelength locker 60 are provided on the Si photonic platform 10 and optically coupled with the tunable laser through a directional coupler 30, and all of these form a TLS chip.

Figure 3:
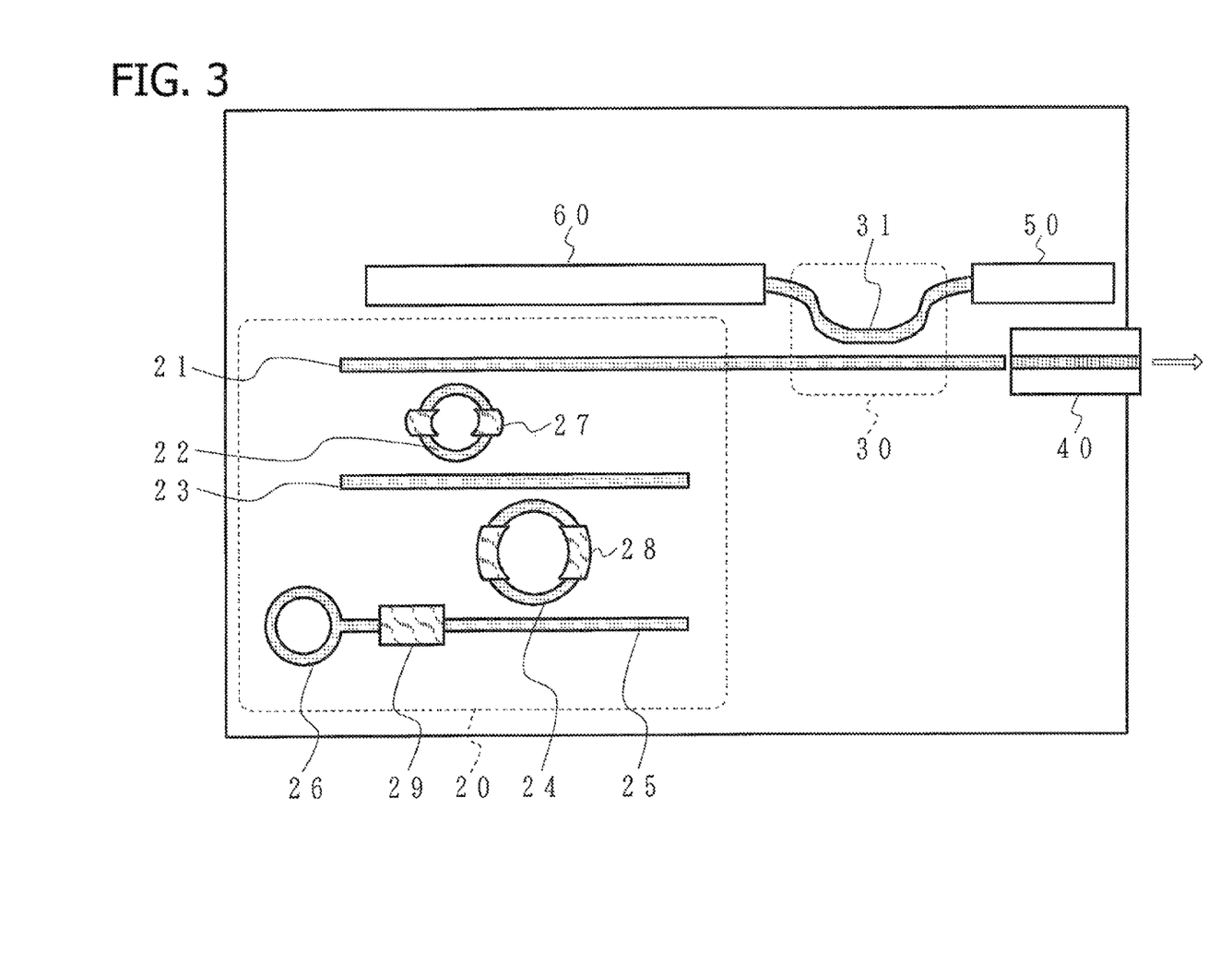
FIG. 3 is a diagram illustrating the resonator formed on the Si photonic platform.

FIG. 3 is a diagram illustrating the resonator formed on the Si photonic platform, which is provided with optical waveguides 21, 23 and 25 formed of an Si photonic wire sandwiched between a BOX layer made of $SiO_2$ and an upper clad layer made of $SiO_2$, and two ring resonators 22 and 24 having different curvature radiuses in order to gain the Vernier effect for selecting a wavelength. In addition, a loop mirror 26 is provided at the end portion of the optical waveguide 25 as a total reflection mirror. Though the size of the Si photonic wire is not particularly defined, here, the thickness is 250 nm and the width is 500 nm.

The two ring resonators 22 and 24 are provided with heaters 27 and 28 in order to carry out wavelength tuning by changing the refractive index, and a heater 29 for adjusting the phase is provided along the optical waveguide 25 in a location directly in front of the loop mirror 26. In addition, a directional coupler 30 is formed along the optical waveguide 21 with a coupling waveguide 31 arranged in proximity.

Figure 4:
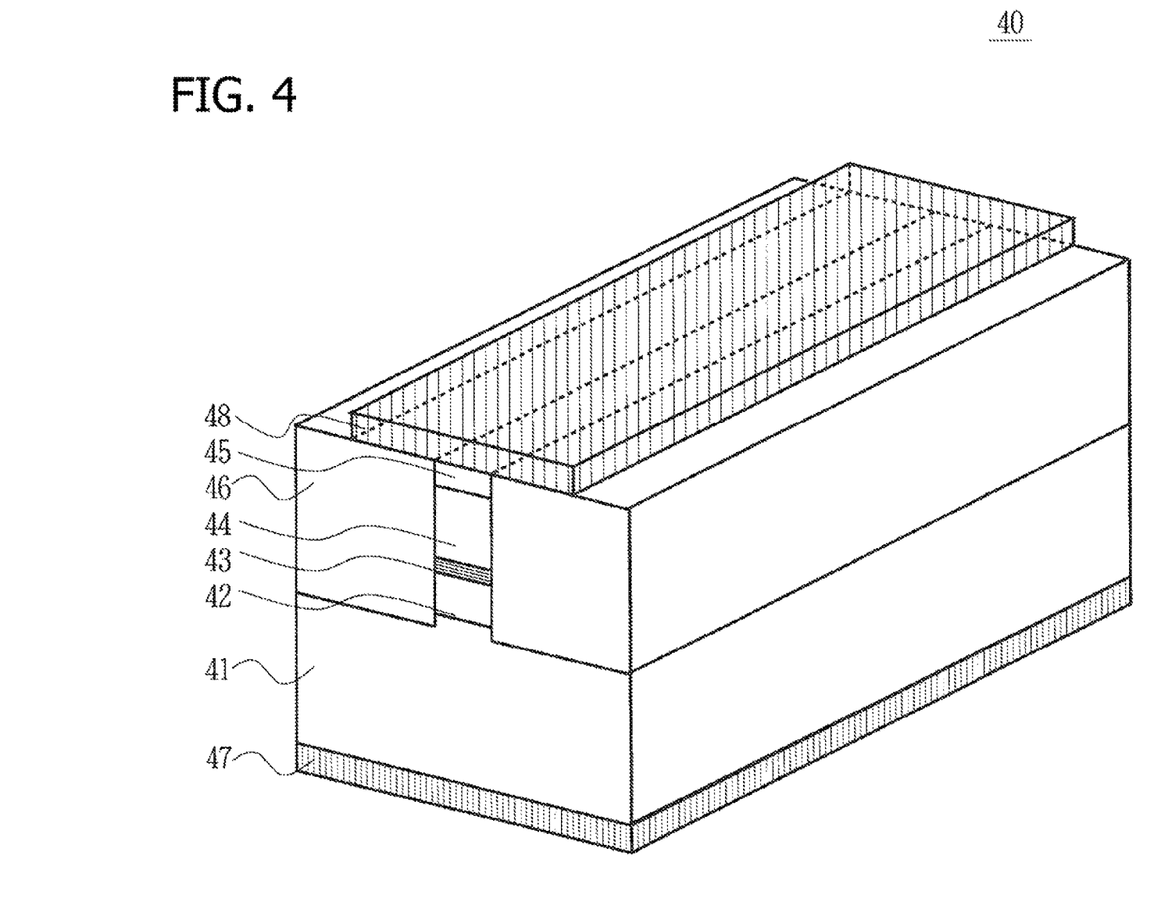
FIG. 4 is a schematic perspective diagram illustrating an example of an SOA that is used for the tunable laser source according to Example 1 of the present invention.

FIG. 4 is a schematic perspective diagram illustrating an example of an SOA that is used for the tunable laser source according to Example 1 of the present invention, where an n type InP clad layer 42, an MQW active layer 43, a p type InP clad layer 44 and a p type InGaAs contact layer 45 are sequentially deposited on an n type InP substrate 41. Next, a portion of the multilayer from the p type InGaAs contact layer 45 through the n type InP substrate 41 is etched in a striped form so as to form a mesa structure, and this mesa structure in a striped form is buried with an Fe-doped InP burying layer 46. An n side electrode 47 is formed on the rear surface of the n type InP substrate 41, and a p side electrode 48 is provided on the p type InGaAs contact layer 45. The MQW active layer 43 is formed of, for example, six GaInAsP well layers having a thickness of 5.1 nm and seven GaInAsP barrier layers having a thickness of 10 nm, which are layered alternately.

Though not shown, an anti-reflecting coating is provided on the entrance plane of the SOA 40 in such a manner that the cleavage plane, which is the output plane of the SOA 40, and the loop mirror 26 form a resonator for a tunable laser. The SOA 40 is mounted in a region that has been dug out of a portion of the single crystal silicon substrate in an SOI substrate.

Figure 5:
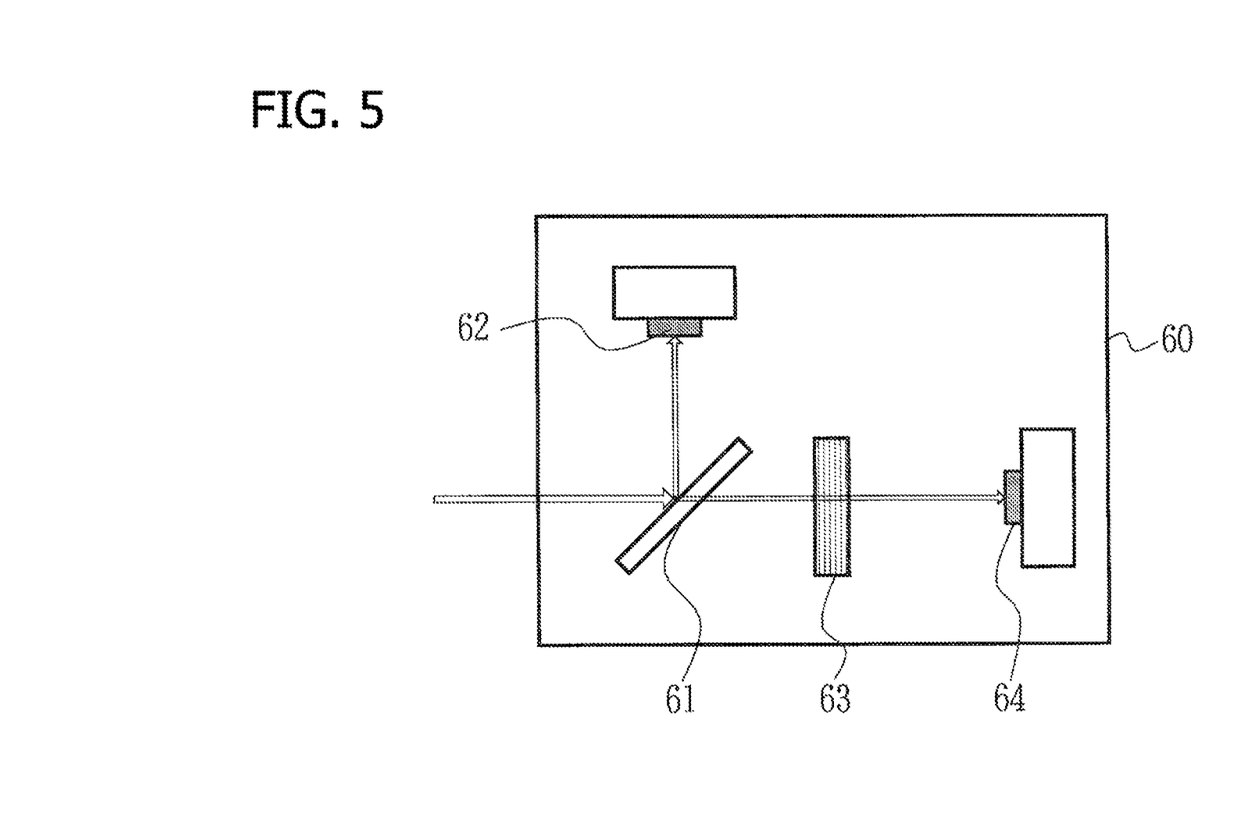
FIG. 5 is a schematic diagram illustrating the configuration of an example of a wavelength locker that is used for the tunable laser source according to Example 1 of the present invention.

FIG. 5 is a schematic diagram illustrating the configuration of an example of a wavelength locker that is used for the tunable laser source according to Example 1 of the present invention. A wavelength locker 60 is formed of a half mirror 61, a photodiode 62 for monitoring the light output, an etalon filter 63, and a photodiode 64 for monitoring the wavelength. The monitoring light that has been incident through the coupling waveguide 31 from the directional coupler 30 is split in two by the half mirror 61. One of them enters into the photodiode 62 so as to monitor the light output. The other transmits through the etalon filter 63, and then enters into the photodiode 64. The wavelength transmission properties of the etalon filter 63 have periodicity, and therefore, in the case where the wavelength of the light outputted from the tunable laser fluctuates due to deterioration over time, the change in the wavelength is detected by the photodiode 64.

A photodiode made of a compound semiconductor is used for the power monitor 50, which is mounted in a region that has been dug out of a portion of the single crystal silicon substrate in an SOI substrate. Here, the width of the single crystal silicon layer in a portion that has extended from the coupling waveguide 31 made of an Si photonic wire may be widened, and a germanium layer may be grown on top of that so as to form a germanium photodiode, which may be used as the power monitor 50. The Si photonic platform 10 is mounted on a TEC (thermo-electric cooler) for stabilizing the temperature of the element.

In Example 1 of the present invention, a directional coupler, which is a 2×2 type optical splitter, is used as the optical splitter, and therefore, only one optical splitter needs to be used in order to achieve both the miniaturization of the tunable laser source and the reduction in the loss. Furthermore, a directional coupler has a smaller loss as compared to a Y-shaped branch, and therefore, it is possible to reduce the loss as compared to the prior art.

EXAMPLE 2

Figure 6:
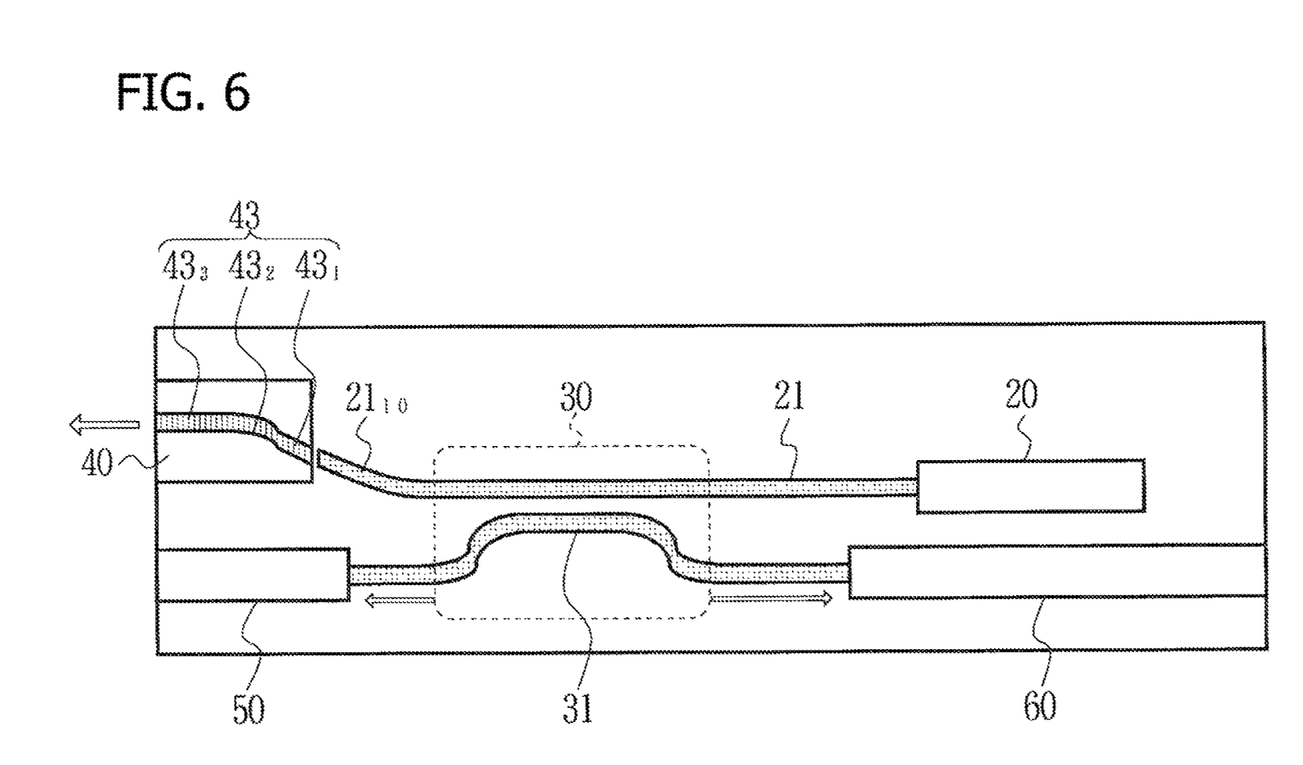
FIG. 6 is a schematic diagram illustrating the configuration of the tunable laser source according to Example 2 of the present invention.

Next, the tunable laser source according to Example 2 of the present invention is described in reference to FIG. 6, wherein the reflection between the above-described SOA and the resonator in Example 1 is prevented. FIG. 6 is a schematic diagram illustrating the configuration of the tunable laser source according to Example 2 of the present invention. In Example 2, an inclined portion $21_{10}$ is provided on the output end side of the optical waveguide 21, and at the same time, the MQW active layer 43 in the SOA 40 is formed of an inclined waveguide $43_1$ that is inclined by an angle of 7° relative to the normal of the end surface, a bent waveguide $43_2$ and a linear waveguide $43_3$. As a result, the reflection between the end surface on the incident side of the SOA 40 and the output end of the optical waveguide 21 can be prevented.

EXAMPLE 3

Figure 7:
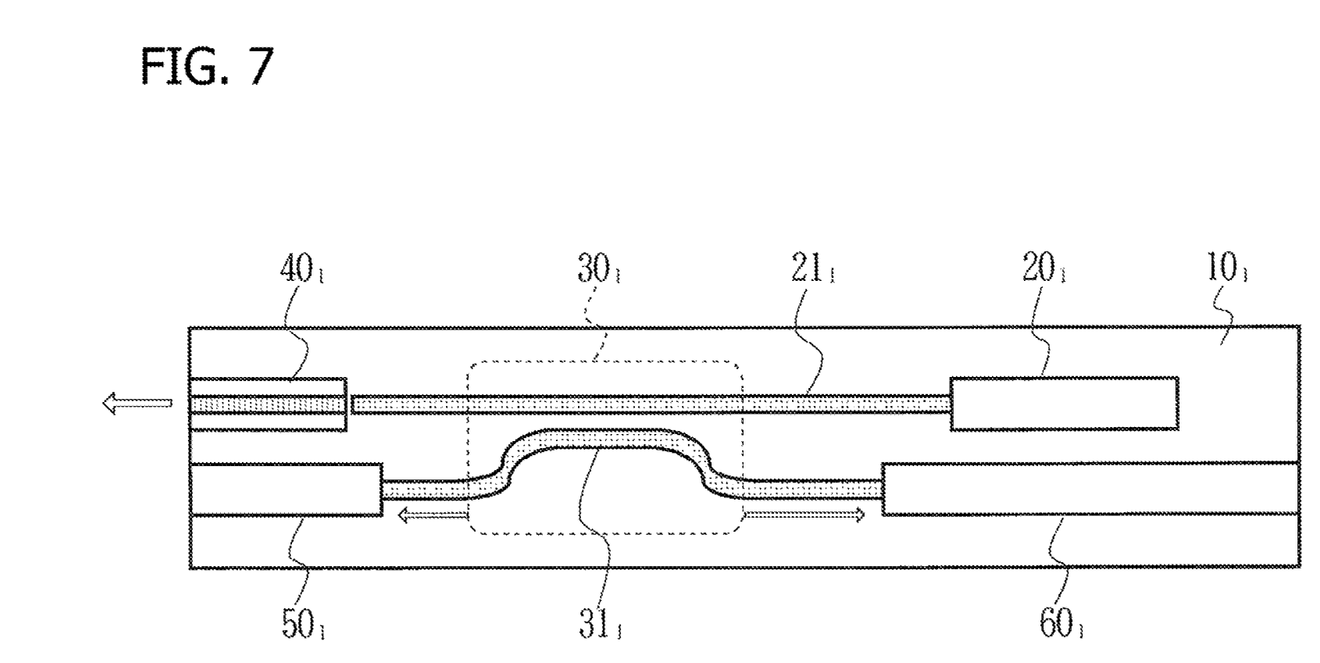
FIG. 7 is a schematic diagram illustrating the configuration of the tunable laser source according to Example 3 of the present invention.

Next, the tunable laser source according to Example 3 of the present invention is described in reference to FIG. 7, wherein the above-described Si photonic platform in Example 1 is replaced with a compound semiconductor substrate $10_1$. FIG. 7 is a schematic diagram illustrating the configuration of the tunable laser source according to Example 2 of the present invention. In Example 3, the multilayer structure for forming the SOA $40_1$ is used to form a resonator $20_1$, a power monitor $50_1$ and a wavelength locker $60_1$ in a butt joint structure.

In Example 3, only the etalon filter needs to be mounted in a hybrid manner, and therefore, the mounting costs can be reduced. In Example 3 as well, the SOA $40_1$ and the optical waveguide $21_1$ may have an inclined structure in the same manner as in Example 2.

EXAMPLE 4

Figure 8:
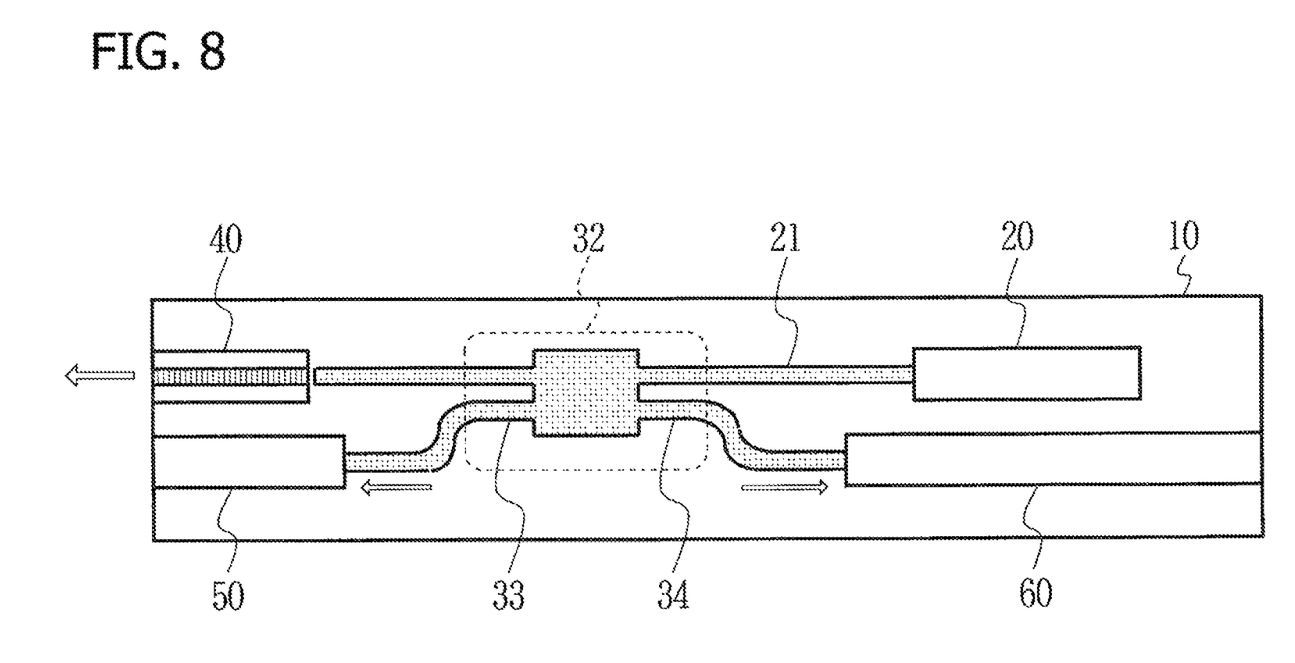
FIG. 8 is a schematic diagram illustrating the configuration of the tunable laser source according to Example 4 of the present invention.

Next, the tunable laser source according to Example 4 of the present invention is described in reference to FIG. 8, wherein the above-described directional coupler in Example 1 is replaced with a 2×2 MMI coupler 32. FIG. 8 is a schematic diagram illustrating the configuration of the tunable laser source according to Example 4 of the present invention. In Example 4, a 2×2 MMI coupler 32 is provided along the optical waveguide 21 in such a manner that the power monitor 50 is connected to one output port 33, and the wavelength locker 60 is connected to the other output port 34.

In Example 4, the 2×2 MMI coupler 32 is used as the optical splitter, and therefore, the split ratio can be made smaller in terms of the wavelength properties. In Example 4, the SOA 40 and the optical waveguide 21 may have an inclined structure in the same manner as in Example 2, or the entirety may be made of a compound semiconductor as in Example 3.

EXAMPLE 5

Figure 9:
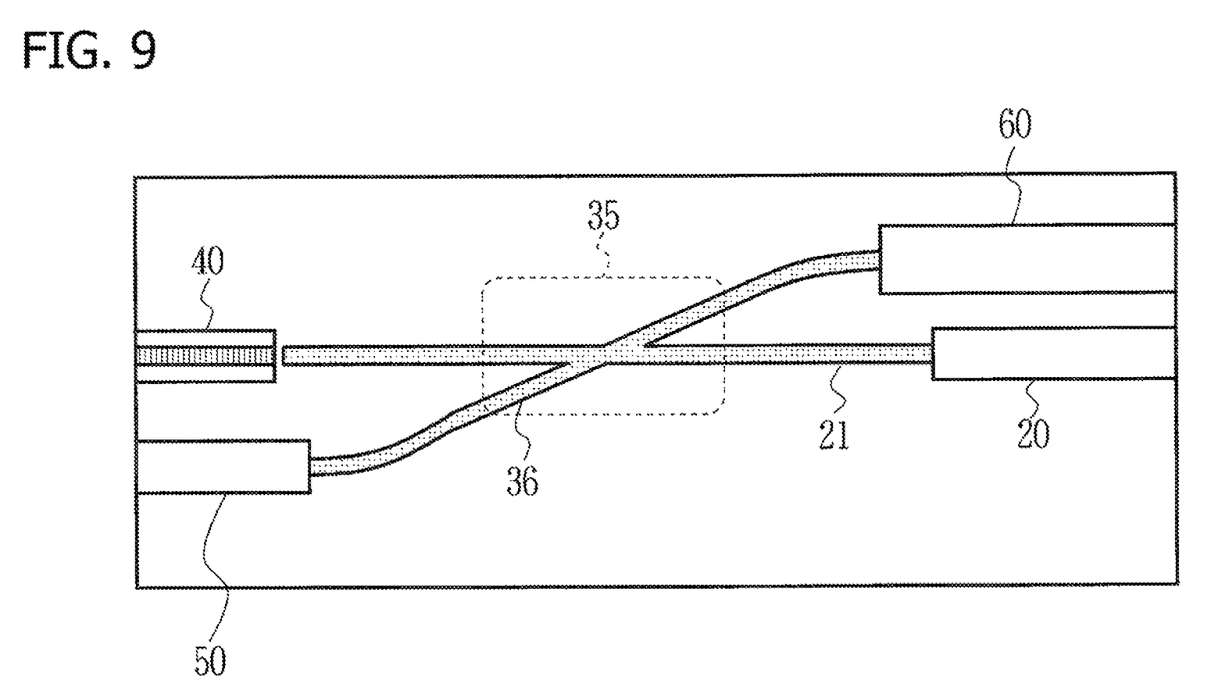
FIG. 9 is a schematic diagram illustrating the configuration of the tunable laser source according to Example 5 of the present invention.

Next, the tunable laser source according to Example 5 of the present invention is described in reference to FIG. 9, wherein the above-described directional coupler in Example 1 is replaced with crossing waveguides 35. FIG. 9 is a schematic diagram illustrating the configuration of the tunable laser source according to Example 5 of the present invention. In Example 5, an optical waveguide 36 that crosses the optical waveguide 21 is provided as the crossing waveguides 35, which work as an optical splitter. The power monitor 50 is connected to one end portion of the optical waveguide 36, and the wavelength locker 60 is connected to the other end portion.

In Example 5 as well, the SOA 40 and the optical waveguide 21 may have an inclined structure in the same manner as in Example 2, or the entirety may be made of a compound semiconductor as in Example 3.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A tunable laser source, comprising:
    a single semiconductor optical amplifier that outputs one part of amplified light from one end as output light and another part of the amplified light from another end;
    a resonator that forms a tunable laser together with the semiconductor optical amplifier and that receives the other part of the amplified light outputted from the other end of the semiconductor optical amplifier;
    a 2×2 type optical splitter that is optically coupled with the semiconductor optical amplifier and the resonator and that splits part of the light within the tunable laser into two light beams;
    a light intensity monitor into which one light beam from among the two light beams split by the optical splitter enters from a resonator side of the optical splitter; and
    a wavelength locker into which the other light beam from among the two light beams split by the optical splitter enters from a semiconductor optical amplifier side of the optical splitter.

2. The tunable laser source according to claim 1, wherein the optical splitter is a directional coupler.

3. The tunable laser source according to claim 1, wherein the optical splitter is a multimode interference coupler.

4. The tunable laser source according to claim 1, wherein the optical splitter is crossing waveguides.

5. The tunable laser source according to claim 1, wherein the resonator is formed of a silicon photonic wire.

6. The tunable laser source according to claim 5, wherein the light intensity monitor has a germanium layer layered on top of a silicon layer.

7. The tunable laser source according to claim 1, wherein at least the semiconductor optical amplifier, the resonator, the optical splitter and the light intensity monitor are formed of a III-V compound semiconductor in a monolithic manner.

8. The tunable laser source according to claim 1, wherein the optical splitter is a directional coupler.

9. The tunable laser source according to claim 1, wherein the optical splitter is a multimode interference coupler.

10. The tunable laser source according to claim 1, wherein the optical splitter is crossing waveguides.

11. The tunable laser source according to claim 1, wherein the resonator is formed of a silicon photonic wire.

12. The tunable laser source according to claim 11, wherein the light intensity monitor has a germanium layer layered on top of a silicon layer.

13. The tunable laser source according to claim 1, wherein at least the semiconductor optical amplifier, the resonator, the optical splitter and the light intensity monitor are formed of a III-V compound semiconductor in a monolithic manner.

* * * * *